United States Patent [19]

Sakakima et al.

[11] Patent Number: 4,904,543
[45] Date of Patent: Feb. 27, 1990

[54] COMPOSITIONALLY MODULATED, NITRIDED ALLOY FILMS AND METHOD FOR MAKING THE SAME

[75] Inventors: Hiroshi Sakakima; Koichi Osano, both of Osaka, Japan

[73] Assignee: Matsushita Electric Industrial Co., Ltd., Japan

[21] Appl. No.: 184,827

[22] Filed: Apr. 22, 1988

[30] Foreign Application Priority Data

Apr. 23, 1987 [JP] Japan .................................. 62-100400
Jul. 23, 1987 [JP] Japan .................................. 62-184605

[51] Int. Cl.$^4$ ........................ H01F 10/14; G11B 5/127
[52] U.S. Cl. ................................... 428/610; 428/627; 428/635; 428/428; 204/192.2
[58] Field of Search ............... 428/610, 928, 627, 607, 428/606, 635; 204/192.2

[56] References Cited

U.S. PATENT DOCUMENTS

| | | | |
|---|---|---|---|
| 4,231,816 | 11/1980 | Cuomo et al. | 204/192.2 |
| 4,640,755 | 2/1987 | Sato | 204/192.2 |
| 4,661,418 | 4/1987 | Yanai et al. | 428/610 |
| 4,663,193 | 5/1987 | Endo et al. | 204/192.2 |
| 4,698,272 | 10/1987 | Inokuti et al. | 428/627 |
| 4,698,273 | 10/1987 | Komuro et al. | 428/928 |
| 4,714,641 | 12/1987 | Cordts | 428/610 |

FOREIGN PATENT DOCUMENTS

| | | | |
|---|---|---|---|
| 54-94428 | 7/1979 | Japan . | |
| 58-138794 | 8/1983 | Japan | 428/928 |
| 58-138795 | 8/1983 | Japan | 428/428 |
| 60-152651 | 8/1985 | Japan . | |
| 62-285406 | 12/1987 | Japan | 204/192.2 |

OTHER PUBLICATIONS

E. R. Wuori et al., "Nitrogen-Induced fcc Phase in rf Sputtered Co-Cr films having the hcp-Phase and Perpendicular Anisotropy", J. Vac. Sci. Technol., 20(2), Feb. 1982, pp. 171-174.

T. Serikawa, "Permalloy Film Preparation by RF Sputtering", Review of the Electrical Communications Laboratories, vol. 25, Nos. 3-4, Mar.-Apr. 1977, pp. 209-216.

H. W. Pötzlberger, "Magnetron Sputtering of Permalloy for Thin-Film Heads", IEEE Transactions of Magnetics, vol. MAG-20, No. 5, Sep. 1984, pp. 851-853.

T. Takahashi, "Metastable $F_e$ Nitrides with High $B_s$ Prepared by Reactive Sputtering", J. Appl. Phys., 53(11), Nov. 1982, pp. 8332-8334.

H. Maeda, "Effect of Nitrogen on the High Coercivity and Microstructures of $C_o$-Ni Alloy Films", J. Appl. Phys., 53(10), Oct. 1982, pp. 6941-6945.

Primary Examiner—John J. Zimmerman
Attorney, Agent, or Firm—Lowe, Price, LeBlanc, Becker & Shur

[57] ABSTRACT

Magnetic Fe alloy films in which at least nitrogen is compositionally modulated along the thickness of the film substantially in the form of a sine wave. By the compositional modulation, the Fe alloy film having high saturation magnetization is imparted with good resistances to corrosion and wear. The method of making a compositionally modulated Fe alloy film is described. The compositional modulation may be realized by merely superposing at least one nitrided layer and at least one nitride-free layer. The thermal treatment of the superposed layers is effective for the modulation where the content of the nitrogen in the film is compositionally modulated.

33 Claims, 3 Drawing Sheets

COMPOSITIONALLY MODULATED, NITRIDED ALLOY FILMS AND METHOD FOR MAKING THE SAME

BACKGROUND OF THE INVENTION

1. Field of the Invention

This invention relates to soft magnetic materials and more particularly, to compositionally modulated, nitrided alloy films which exhibit a small coercive force, Hc, and are thus suitable for use as magnetic heads. The invention also relates to a method for making such alloy films.

2. Description of the Prior Art

As is well known in the art, existing magnetic heads are usually made of Sendust alloys mainly composed of Fe-Si-Al, amorphous alloys such as Co-Nb-Zr, or ferrites which are small in high frequency loss. In recent years, there is a great tendency toward high density recording of information, for which recording mediums are now being switched over to those mediums having a higher coercive force than conventional mediums. This, in turn, requires soft magnetic materials which have a higher saturation magnetization, $4\pi Ms$. In addition, magnetic materials for the magnetic head are generally required to have good corrosion and wear resistances as well as the high saturation magnetization. Although ferrites have good corrosion and wear resistances, the saturation magnetization is unsatisfactorily as low as 5000 to 6000 G. Amorphous alloys have good magnetic characteristics but are so poor in heat resistance that they are crystallized at high temperatures, resulting in deterioration of the characteristic properties. Currently-available amorphous alloys which can withstand a magnetic head gap bonding process are those alloys whose saturation magnetization is, at most, about 10,000 G. Sendust alloys exhibit a saturation magnetization of about 12,000 G but are poor in corrosion resistance. In order to improve the corrosion resistance, Cr or other metals have to be added to the alloy, thus making it practically difficult to provide an alloy whose saturation magnetization is over 10,000 G. The Sendust alloy to which Cr or the like is added is rather poor in wear resistance.

Recently, attention has been drawn to Fe-Si alloys having high saturation magnetization. However, the Fe-Si alloys do no exhibit excellent soft magnetic characteristics as is different from Fe-Si-Al alloys and Co-Nb-Zr amorphous alloys and are poorer in corrosion and wear resistances. Hence, the alloys cannot be used as a magnetic head core.

Attempts have been made to improve the corrosion resistance of the Fe-Si alloy by incorporation of additives. Typical examples of such alloys include Fe-Si-Ru alloys as described in the Bulletin of the Scientific Lecture of The 8th Meeting of the Japanese Applied Magnetic Society, November, 1984. Although the corrosion resistance of the Fe-Si alloys may be improved to some extent by the addition of such elements, the soft magnetic characteristics are not improved at all with an attendant problem that the use of the additive elements in large amounts results in the reduction of saturation magnetization and the deterioration of soft magnetic characteristics.

In order to obtain magnetic alloys which have good soft magnetic characteristics and good resistances to corrosion and wear, various nitrided alloys have been studied including nitrides of Fe as described in J. Appl. Phys. 53(11) P. 8332 (1982) and nitrides of Fe-B alloys as described in Japanese Laid-open Patent Application Nos. 54-94428 and 60-152651. However, the nitriding will impede soft magnetic characteristics. In particular, these alloys present the problem that a coercive force, Hc, which is an index of soft magnetic characteristics, becomes very large.

SUMMARY OF THE INVENTION

It is accordingly an object of the invention to provide a soft magnetic nitrided alloy film which overcomes the problems involved in the prior art.

It is another object of the invention to provide a soft magnetic nitrided alloy film in which at least nitrogen in the alloy is compositionally modulated along the thickness of the film, so that the film has a small coercive force and good resistances to corrosion and wear along with high saturation magnetization.

It is a further object of the invention to provide a soft magnetic nitrided alloy film which has a multilayered structure in which two types of alloy layers are alternately superposed.

It is a still further object of the invention to provide a soft magnetic nitrided alloy film which is mainly composed of Fe and Si with a minor amount of additive elements and at least a concentration of the nitrogen is compositionally modulated along the thickness of the film whereby has improved thermal stability.

It is another object of the invention to provide a soft magnetic Fe-Si-Ru-N alloy film whose nitrogen concentration along the thickness of the film is compositionally modulated or changed whereby resistances to corrosion and wear are significantly improved.

It is still another object of the invention to provide a method for making a soft magnetic alloy film of the type mentioned above which is compositionally modulated or changed along the thickness of the film.

Broadly, the present invention contemplates to provide a magnetic alloy film which consists essentially of an alloy having an average composition of the formula (1)

$$T_{\bar{a}}X_{\bar{b}}N_{\bar{c}} \tag{1}$$

in which T is at least one member selected from the group consisting of Fe, and mixtures of Fe/Co and Fe/Ni, X is at least one member selected from the group consisting of Si, Ge, Si/Ge, and Ge/Al, N is nitrogen, a, b and c are, respectively, values by atomic percent in the ranges of $71 \leq \bar{a} \leq 97$, $2 \leq \bar{b} \leq 28$ and $1 \leq \bar{c} \leq 20$ provided that $\bar{a} + \bar{b} + \bar{c} = 100$. At least the nitrogen is compositionally modulated or changed along the thickness of the film. For instance, at least a concentration of the nitrogen along the thickness may be changed or modulate in the form of a rectangle or a sine wave.

It will be noted here that the term "compositionally modulated alloy film" used herein is intended to mean that the concentration of at least one element in the alloy film is changed or modulated along the thickness of the film. In a broad sense, a multilayered or composite film composed of non-nitrided alloy layers and nitrided alloy layers, which are superposed alternately, is also included within the scope of the compositionally modulated film in the practice of the invention.

The compositionally modulated alloy film described above may further comprises small amounts of additive elements such as Nb, Ta, Ti, Zr, Hf, Cr, Mo and/or W.

In accordance with a preferred and more specific embodiment of the invention, there is also provided a compositionally modulated, nitrided alloy film which consists essentially of an alloy having an average composition of the formula (2)

$$Fe_{\bar{x}}Si_{\bar{y}}N_{\bar{z}}T'_{\bar{w}} \qquad (2)$$

in which T' represents at least one element selected from the group consisting of Nb, Ta, Ti, Zr, Hf, Cr, Mo and W, and x, y, z and w are, respectively, average values by atomic percent of the respective atoms in the ranges of $70 \leq \bar{x} < 97$, $1 \leq \bar{y} \leq 20$, $1 \leq \bar{z} \leq 15$ and $1 \leq \bar{w} \leq 10$. In the film, at least the nitrogen should be compositionally modulated along the thickness of the film. These Fe-Si-N alloy films are significantly improved in thermal stability.

In another specific and preferable embodiment of the invention, there is also provided a compositionally modulated alloy film which consists essentially of an alloy having an average composition of the following formula (3)

$$Fe_{\bar{e}}Si_{\bar{f}}Ru_{\bar{g}})_{(100-\bar{h})/100}N_{\bar{h}} \qquad (3)$$

in which $\bar{e}$, $\bar{f}$, $\bar{g}$ and $\bar{h}$ are, respectively, average values by atomic percent such that $70 \leq \bar{e} \leq 96$, $3 \leq \bar{f} \leq 20$ $1 \leq \bar{g} \leq 6$ and $1 \leq \bar{h} \leq 15$, and in which the nitrogen in the film is compositionally modulated along the thickness of the film. The compositionally modulated Ru-containing Fe-Si-N alloy film is pronouncedly improved in corrosion and wear resistances.

All the alloy films described above can be made by a method which comprises subjecting a nitrogen-free Fe alloy target with or without additive elements to sputtering first in an atmosphere of Ar gas for a time sufficient to form a nitride-free Fe alloy layer on a substrate in a desired thickness and then in the Ar gas atmosphere to which nitrogen gas is added to a level of from 0.1 to 50% by partial pressure, so that a nitrided-alloy layer is formed on the nitride-free Fe alloy layer, thereby forming a nitrided alloy film. The multilayered film is preferably annealed or thermally treated at a temperature of from 300° to 700° C. for a time sufficient to cause the modulation. It will be noted that the sputtering may be effected only in an Ar gas using two targets including an Fe nitrided alloy target and a nitride-free Fe-Si alloy target with or without other additive elements, but alternate formation of the nitride-free alloy layers and the nitride alloy layers by the above-described method is more convenient in practice.

DETAILED DESCRIPTION AND EMBODIMENTS OF THE INVENTION

Figure 1A:
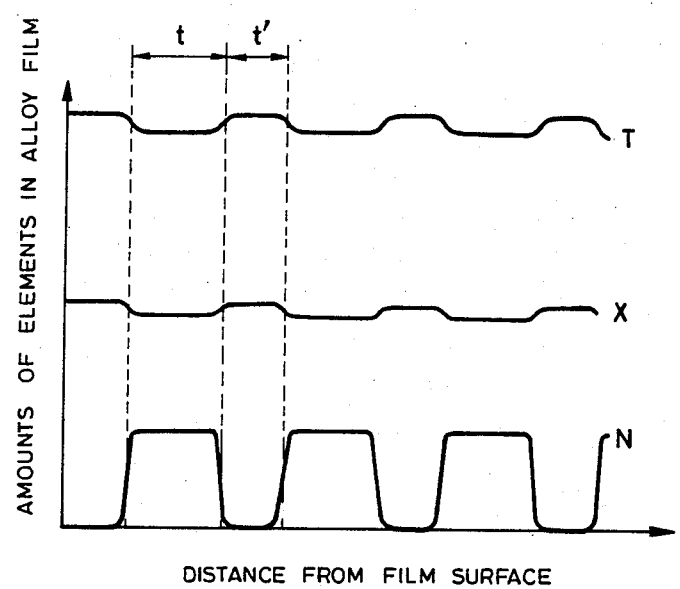
FIGS. 1a and 1b are, respectively, compositional profiles along the depth of a multilayered alloy film comprised of nitride layers and nitride-free layers superposed alternately and a multilayered alloy film where nitrogen is compositionally modulated.
Figure 1B:
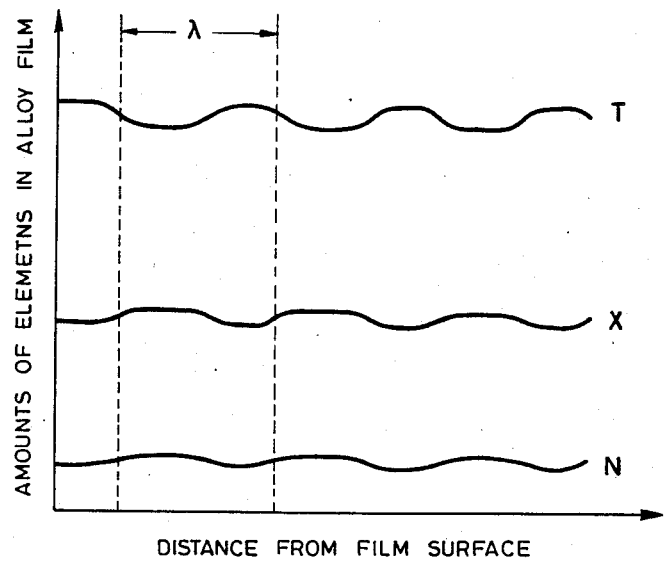

It has been experimentally found that when soft magnetic alloys, such as Fe-Si, Fe-Co-Si, Fe-Ge-Al, Fe-Si-Ga and the like alloys, exhibiting soft magnetic characteristics are nitrided, the corrosion and wear resistances are improved with a sacrifice of good soft magnetic characteristics. When these soft magnetic alloys are thermally treated at high temperatures, the magnetic characteristics which have once deteriorated are not readily restored. The alloy films of the invention can solve this problem. When nitrided magnetic alloy layers and nitride-free magnetic alloy layers are superposed alternately to have a multilayer structure as is particularly shown in FIG. 1a, the resultant film exhibits good wear and or abrasion resistances without impeding soft magnetic charcteristics. In FIGS. 1a and 1b, T, X and N have the same meanings as defined before, and t and t' are, respectively, thicknesses of a single nitride layer and a single nitride-free layer. In addition, λ is t+t', meaning a compositional modulation wavelength. When the multilayered film of FIG. 1a is thermally treated, nitrogen is forced into a nitride-free layer through interlaminar diffusion, thereby forming a compositionally modulated, nitrided film as is shown in FIG. 1b. As is different from a single-layer nitrided alloy film in which nitrogen is uniformly distributed at an initial stage, the compositionally modulated, nitrided film does not deteriorate in soft magnetic characteristics and has good corrosion and wear resistances. Moreover, the nitriding is also advantageous in that the electric resistance increases with an increasing skin depth of an electromagnetic wave, so that the resultant film is more suitable for application to high density recording at higher frequencies.

Especially, it has been experimentally confirmed that Fe-Si alloy films has a magnetostriction of substantially zero when the content of Si is about 2 to 18 atomic percent. The Fe-Si alloy film having an Si content of from about 1 to 20 atomic percent has a coercive force, Hc, of not larger than 10 Oe when thermally treated under appropriate conditions. This coercive force value is not necessarily satisfactory, i.e. these alloy films are not satisfactory with respect to the soft magnetic characteristics. In addition, the wear and corrosion resistances of the alloy film are rather poor. Thus, the Fe-Si alloys are not suitable for use as a magnetic head core.

According to the invention, a compositionally modulated alloy film in which the content of nitrogen in the film is compositionally modulated or changed along the thickness of the film is provided, whereby the coercive force can be made smaller with improved wear and corrosion resistances. As defined before, the term "compositionally modulated alloy film" used herein is intended to cover not only a film where the content of at least nitrogen are changed along the thickness of the film as is shown in FIG. 1b, but also a film having a multilayered structure composed of at least one nitride-free alloy layer and at least one nitrided alloy layer as is shown in FIG. 1a. The former film is preferred in the practice of the invention.

The compositionally modulated nitride magnetic alloy film according to one embodiment of the invention has an average composition of the formula (1)

$$T_{\bar{a}}X_{\bar{b}}N_{\bar{c}} \quad (1)$$

in which T is at least one member selected from the group consisting of Fe, Fe/Co and Fe/Ni, X is at least one member selected from the group consisting of Si, Ge, Si/Ga and Ge/Al, and N is nitrogen. Preferably, T is Fe and X is Si. The values of a, b and c indicate average contents by atomic percent of the respective elements and are experimentally determined as follows. In order to obtain a satisfactory saturation magnetization, $4\pi Ms$, the average values by atomic percent should be such that $\bar{a} \geq 71$, $\bar{b} \leq 28$ and $\bar{c} \leq 20$. For obtaining satisfactory resistances to corrosion and wear, $\bar{a} \leq 97$ and $\bar{c} \geq 1$. For good soft magnetic characteristics, at least $\bar{b} \geq 2$.

From the above inequalities, the following inequalities are obtained:

$71 \leq \bar{a} \leq 97$, $2 \leq \bar{b} \leq 28$ and $1 \leq \bar{c} \leq 20$ provided that $\bar{a} + \bar{b} + \bar{c} = 100$.

It should be noted that with a single layer film having an alloy composition within the ranges define above, good soft magnetic characteristics cannot be obtained. In the practice of the invention, it is necessary that nitrided alloy layers each having a thickness of t and nitride-free alloy layers each having a thickness of t' as in FIG. 1a be alternately superposed. The thus obtained multilayered film is more resistant to wear at the nitride layer, with the possibility of causing local wearing. In this sense, it is preferred that the layer thicknesses are determined such that $t \geq t'/2$ and that the nitride layer is an uppermost layer.

As described, the compositionally modulated alloy film according to the invention may be of the multilayered structure type which comprises at least one nitrogen-free alloy layer and at least one nitride alloy layer are merely superposed. The multilayered film may be rather thermally unstable. The conversion of the multilayered film into the so-called compositionally modulated film is readily conducted by subjecting the multilayered film to thermal treatment. Because the bonding between N and T such as Fe is relatively weak, the nitrogen may partly dissociate when the film is treated in vacuum at high temperatures. This will adversely influence not only magnetic characteristics, but also wear and corrosion resistances. This thermal unstability can be overcome by addition of an element which is able to strongly bond to the nitrogen. Such elements include, for example, Nb, Ta, Ti, Zr, Hf, Cr, Mo, W and mixtures thereof.

In a preferred embodiment of the invention, there is provided a compositionally modulated nitrided alloy film which consists essentially of an alloy of the following average composition $$Fe_{\bar{x}}Si_{\bar{y}}N_{\bar{z}}T'_{\bar{w}} \quad (2)$$

in which T' represents at least one element selected from the group consisting of Nb, Ta, Ti, Zr, Hf, Cr, Mo and W. The average atomic percent values are determined for the following reasons. When $70 \leq \bar{x}$, $\bar{y} \leq 20$, $\bar{z} \leq 15$ and $\bar{w} \leq 10$, the saturation magnetization, $4\pi Ms$, becomes larger than 8000 Gausses. For attaining good wear and corrosion resistances, the nitrogen content should be at least such that $1 \leq \bar{z}$. In order to cause the alloy film to develop good soft magnetic characteristics, $1 \leq \bar{y}$. Moreover, in order to impart thermal stability to the alloy, the content of the additive element should be $1 \leq \bar{w}$. As a matter of course, the alloy composition and particularly, at least the concentration of the nitrogen should be modulated along the thickness of the film.

From the above inequalities, it is determined that $70 \leq \bar{x} < 97$, $1 \leq \bar{y} \leq 20$, $1 \leq \bar{z} \leq 15$ and $1 \leq \bar{w} \leq 10$.

With Fe-Si-N alloys, corrosion and wear resistances can be further improved by addition of Ru. This alloy has a composition of the following formula (3)

$$(Fe_{\bar{a}'}Si_{\bar{b}'}Ru_{\bar{c}'})_{(100-\bar{d}')/100}N_{\bar{d}'} \quad (3)$$

The average values are determined as follows. For good soft magnetic characteristics, $\bar{a}' \leq 96$, $\bar{b}' \geq 3$, and $\bar{c}' \leq 6$. For high saturation magnetization, $70 \leq \bar{a}'$, $\bar{b}' \leq 20$, and $\bar{d}' \leq 15$. For imparting high resistances to corrosion ad wear, at least $\bar{c}' \geq 1$ and $\bar{d}' \geq 1$. Gathering these inequalities, $70 \leq \bar{a}' \leq 96$, $3 \leq \bar{b}' \leq 20$, $1 \leq \bar{c}' \leq 6$, and $1 \leq \bar{d}' \leq 15$, each based on atomic percent.

In all the embodiments described above, the compositional modulation wavelength, $\lambda$, as shown in FIG. 1b should preferably be determined such that $\lambda < 2000$ angstroms. Within this range, excellent soft magnetic charcteristics are obtained along with other desired properties being appropriately imparted to the alloy films.

The fabrication of the compositionally modulated alloy films including those films having a multilayered structure defined broadly as a compositionally modulated alloy film is described below. Only for simplicity, a fabrication method using a Fe-Si alloy target is described, but other alloy targets with or without use of additive elements described with regard to the formulae (2) and (3) may likewise be used.

In the method, an Fe-Si target having a Si content within the scope of the invention is subjected to sputtering in an atmosphere of Ar gas at a reduced pressure of from 0.5 to $2 \times 10^{-2}$ Torr., until an Fe-Si alloy layer of a desired thickness is formed on a non-magnetic substrate such as, for example, glass, ceramics and the like. The nitrogen-free Fe-Si alloy layer is generally formed in a thickness of from 50 to 1000 angstroms. Subsequently, a nitrogen gas is introduced into the sputtering atmosphere to an extent of from 0.1 to 50% of the total pressure under which the sputtering is continued, thereby forming a nitride alloy layer on the nitride-free layer. This nitrided alloy layer is usually formed in a thickness of from 50 to 1000 angstroms. Preferably, when the thickness of the nitride layer is taken as t and the thickness of the nitride-free layer is taken as t', $t \geq t'/2$. Thereafter, the supply of the nitrogen gas is stopped and the sputtering in an Ar gas is effected to form a nitride-free Fe-Si alloy layer on the nitride alloy layer. In this manner, the above procedure is repeated, thereby superposing a desired number of the nitrogen-free Fe-Si alloy layers and the nitrided Fe-Si alloy layers alternately to obtain a multilayered structure of the alternately superposed layers. In practice, the total thickness of the superposed layers is preferably in the range of from 0.1 to 100 micrometers particularly for use as a magnetic head core. This multilayered alloy film as illustrated in FIG. 1a may be used as it is as a kind of compositionally modulated alloy film.

The sputtering conditions are not critical and may be any ordinary conditions so far as the alloy target used can be sputtered as a layer, including a substrate temperature of from up to 300° C. and a sputtering power of from 5 to 20 W/cm$^2$. These conditions may vary depending upon the type of alloy target.

In a broad sense, the multilayered alloy film is a compositionally modulated film. It is preferred that the multilayered alloy film is subsequently thermally treated at a temperature of from 300° to 700° C. As a result, the nitrogen is interlaminarly diffused from the nitrided alloy layers into the adjacent nitrogen-free layers to form an alloy composition in which the nitrogen is diffused throughout the film with a modulated content of the nitrogen along the thickness of the film as particularly shown in FIG. 1b.

It will be noted that although a nitride-free alloy target and a nitrided alloy target may be used for sputtering, it is more convenient to sputter one nitride-free alloy target while changing the sputtering gas composition as described above.

The present invention is more particularly described by way of examples.

EXAMPLE 1

Figure 2:
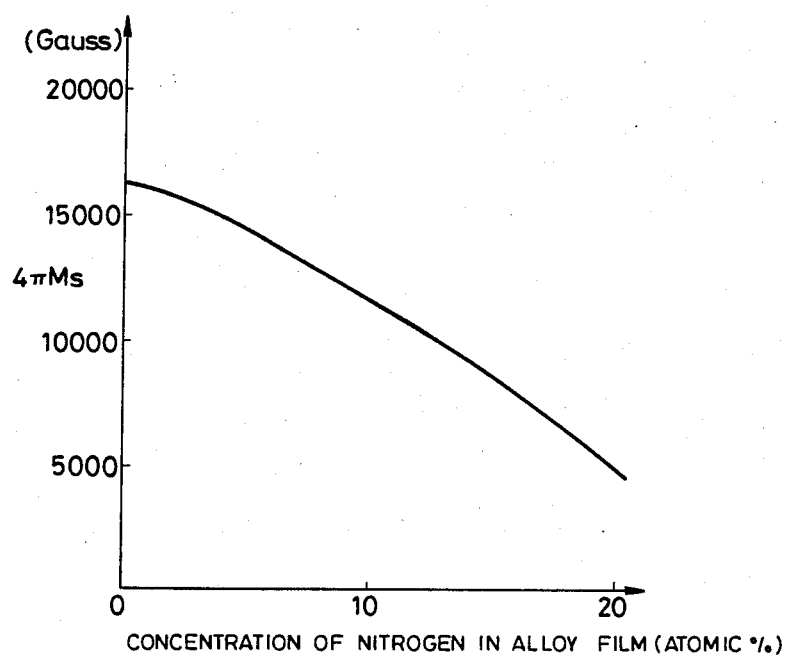
FIG. 2 is a graphical representation of the saturation magnetization of a nitrided Fe-Si alloy film in relation to the variation in concentration of nitrogen.

$Fe_xSi_y$, in which $x+y=100$ and $4 \leq y \leq 24$ on the atomic percent basis, was provided as targets. Each target was placed in an RF sputtering apparatus and subjected to sputtering at an Ar gas pressure of $1.1 \times 10^{-2}$ Torr., at 350 W while changing a partial pressure of nitrogen gas in the range of from 0 to 50% of the total pressure, thereby forming films each on a glass substrate. These films were subjected to measurement of saturation magnetization, $4\pi Ms$. FIG. 2 shows the results of the measurement in which the saturation magnetization of the films obtained from a target having a composition of $Fe_{80}Si_{20}$ by atomic percent is plotted against the concentration of the nitrogen in the films. The nitride-free film obtained had a composition of $Fe_{82}Si_{18}$.

Moreover, multilayered films each composed of 500 nitride layers and 500 nitride-free layers were made by periodically feeding a given partial pressure of $N_2$ gas to the Ar gas atmosphere. The saturation magnetization of the multilayered films was found to depend greatly on the average composition of the film. With certain elements used as T and/or X of the formula (1), the saturation magnetization was irrespective of the concentration of the nitrogen within a certain range of the saturation magnetization, or even increased. However, when the nitrogen content was over 20 atomic percent, the saturation magnetization was found to decrease, or good soft magnetic characteristics could not be obtained. Thus, $c \leq 20$.

Thereafter, the alloy film of $Fe_{82}Si_{18}$, and the compositionally modulated alloy films of $(Fe_{82}Si_{18})_{0.995}N_{0.5}$ $(Fe_{82}Si_{18})_{0.99}N_{1.0}$ and $(Fe_{82}Si_{18})_{0.9}N_{10}$ were subjected to a corrosion resistance test and also to measurement of an electric resistance. The corrosion resistance test was effected by immersing a sputtered film in pure water and allowing it to stand at room temperature for 24 hours, after which corrosion production was visually observed. The corrosion resistance test was evaluated by four ranks: "poor" means a fair degree of corrosion production, "moderate" means a slight degree of corrosion production, "good" means little degree of corrosion production, and "very good" means no degree of corrosion production. The electric resistance was determined by a four-terminal method. The results are shown in Table 1 below.

| Film Composition (atomic %) | Corrosion Resistance | Electric Resistance (microohms-cm) |
| --- | --- | --- |
| $Fe_{82}Si_{18}$ | poor | 70 |
| $(Fe_{82}Si_{18})_{0.995}N_{0.5}$ | moderate | 100 |
| $(Fe_{82}Si_{18})_{0.99}N_{1.0}$ | good | 140 |
| $(Fe_{82}Si_{18})_{0.9}N_{10}$ | very good | 200 |

As will be clear from the above results, the corrosion resistance of the compositionally modulated films depends substantially on the average composition. It will be noted that the compositions of the nitride films in the table are expressed by an average composition. The electric resistance increases with an increasing amount of nitrogen in the film. For metal materials whose surface skin depth is in the order of several micrometers, a current tendency is to insert an interlayer insulating film as higher frequency signals are employed for recording. In order to reduce a spacing loss, it is preferred to increase the electric resistance so as to increase the skin depth.

Needless to say, the corrosion resistance may vary depending upon the types of T and X and the values of a and b in the formula (1). For developing a significant effect of suppressing the corrosion production, the content of nitrogen should be $\bar{c} \geq 1\%$. The corrosion resistance was more improved at a higher content of N.

EXAMPLE 2

The general procedure of Example 1 was repeated, thereby forming a $Fe_{82}Si_{18}$ single layer film, a $(Fe_{82}Si_{18})_{0.88}N_{12}$ single layer film, and a compositionally modulated film whose nitride layers had an average composition of $(Fe_{82}Si_{18})_{0.88}N_{12}$ and which was made of 500 nitrogen-free layers and 500 nitride layers each having a thickness of 200 angstroms.

Figure 3A:
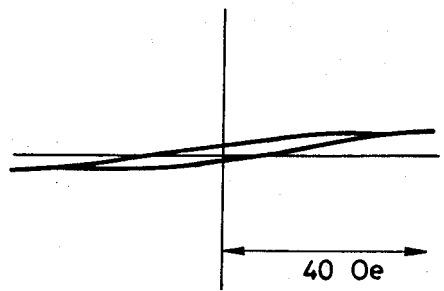
FIGS. 3a and 3b are, respectively, B-H curves of an Fe-Si alloy film prior to and after thermal treatment.
Figure 3B:
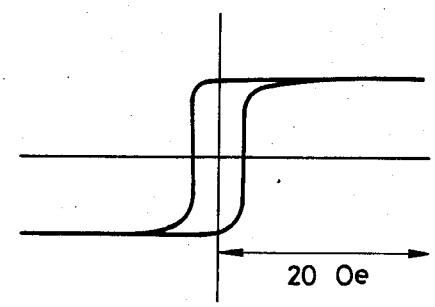
Figure 4A:
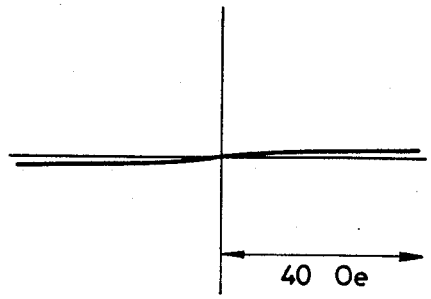
FIGS. 4a and 4b are, respectively, B-H curves of a nitrided Fe-Si single layer film prior to and after thermal treatment.
Figure 4B:
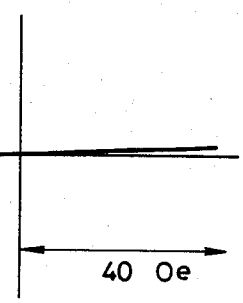
Figure 5A:
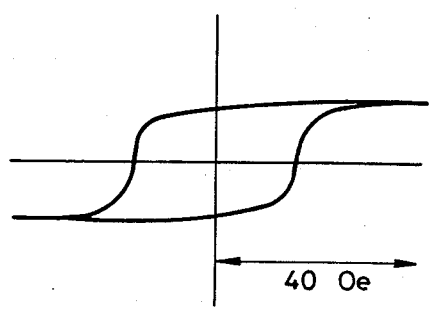
FIGS. 5a and 5b are, respectively, B-H curves of a nitrided Fe-Si multilayered film and a compositionally modulated, nitrided Fe-Si film.
Figure 5B:
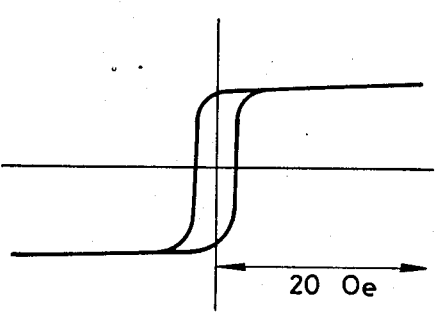

These films were subjected to measurement of a B-H curve at 60 Hz (a) prior to and (b) after heat treatment at 510° C. for 30 minutes in a magnetic field. The results are shown in FIGS. 3a and 3b for the $Fe_{82}Si_{18}$ single layer film, in FIGS. 4a and 4b for the nitrided single layer film, and in FIGS. 5a and 5b for the modulated film. From the figures, it will be seen that the modulated film shows a good B-H curve particularly after the heat treatment.

Moreover, these films were each subjected to measurements of saturation magnetization, corrosion resistance and Knoop hardness. The results are summarized in Table 2 below. The saturation magnetization was determined by the use of a vibration type magnetometer.

TABLE 2

| | Saturation Magnetization (Gauss) | Corrosion Resistance | Knoop Hardness (Kg/mm) |
| --- | --- | --- | --- |
| Compositionally modulated Fe—Si—N film | 12800 | very good | 1120 |
| Fe—Si—N single layer film | 10800 | very good | 1040 |
| Fe—Si single layer film | 16300 | poor | 800 |

The compositionally modulated film of the invention is better than the other films as a whole.

Figure 6:
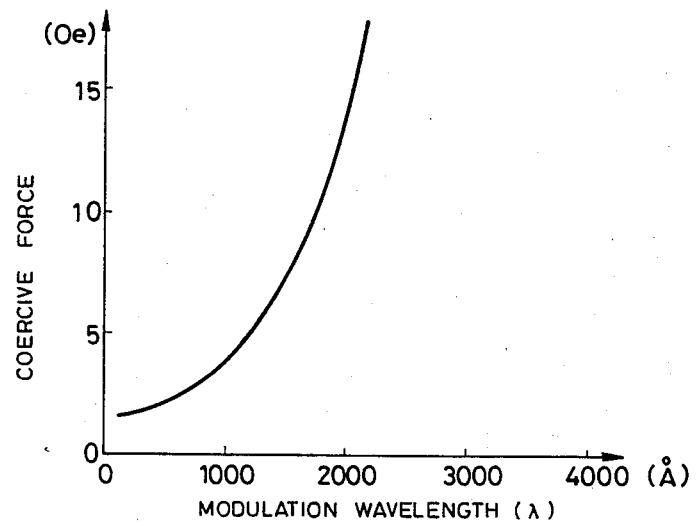
FIG. 6 is a graph showing a coercive force of a modulated, nitrided Fe-Si film in relation to the variation in modulation wavelength.

FIG. 6 shows a coercive force, Hc, of the compositionally modulated Fe-Si-N film, which has been thermally treated at 510° C. for 30 minutes in a magnetic field, in relation to the variation in the modulated wavelength, λ. The figure reveals that the compositionally modulated film is very high in the soft magnetic characteristic. The average content of N in the modulated film is 6 atomic percent. It was found that when an Fe-Si-N single film having 6 atomic percent of nitrogen was thermally treated under the same conditions as indicated above, good soft magnetic characteristics could not be obtained. It should be noted, however, that if the thermal treatment is effected at too high a temperature, or for too long a time, the coercive force may again increase. Accordingly, choice of thermal treating temperature and time is necessary.

The single layer nitrided film and the compositionally modulated, nitrided film have not necessarily the same level of hardness for the same composition. If the compositional modulation wavelength, λ, is at the same level, nitrided films, modulated or not, have an increasing hardness with an increase of the nitrogen content. However, an excessive amount of nitrogen results in a reduction of saturation magnetization. The nitrogen content should be not larger than 20 atomic percent. The coercive force of the Fe-Si-N single layer film is significantly higher than that of the nitride-free film. As will be seen from FIG. 4b, the thermally treated film is not satisfactory with respect to the soft magnetic characteristics. On the other hand, the compositionally modulated film exhibits a pronouncedly reduced coercive force when the modulation wavelength is 2000 angstroms or below.

EXAMPLE 3

The general procedure of Example 1 or 2 was repeated except that the Fe-Si alloy target was replaced by an Fe-Co-Si alloy target, an Fe-Si-Ga alloy target, and an Fe-Ge-Al alloy target, thereby obtaining nitride-free single layer films and compositionally modulated, nitrided films obtained from 500 nitride-free layers and 500 nitride alloy layers superposed alternately.

These films were each subjected to measurements of corrosion resistance, wear resistance, saturation magnetization, coercive force after thermal treatment, and specific resistance.

The wear resistance was determined by a commercial video tape recorder to which a magnetic head having each film at the tip thereof was attached and a video tape was run over 100 hours, after which a wear loss of the head was measured. The wear loss of a modulated film is indicated as an index to a wear loss of a nitride-free film which is taken as 1. All the modulated films used had a modulation wavelength of 500 angstroms and thus a total thickness of 25 micrometers. The results are shown in Table 3 below.

TABLE 3

| Average Composition (atomic %) | Corrosion Resistance | Wear Loss | Saturation Magnetization (Gauss) | Coercive Force (Oe) | Specific Resistance (microohms-cm) |
| --- | --- | --- | --- | --- | --- |
| $Fe_{69}Co_{13}Si_{18}$ | poor | 1 | 13000 | 4 | 70 |
| $(Fe_{69}Co_{13}Si_{18})_{0.94}N_6$ | very good | 0.1 | 12000 | 2.5 | 140 |
| $Fe_{74}Si_{17}Ga_9$ | poor | 1 | 11000 | 1.0 | 80 |
| $(Fe_{74}Si_{17}Ga_9)_{0.94}N_6$ | good | 0.2 | 10000 | 1.0 | 160 |
| $Fe_{84}Ge_6Al_{10}$ | poor | 1 | 14000 | 2.0 | 80 |
| $(Fe_{84}Ge_6Al_{10})_{0.94}N_6$ | very good | 0.15 | 12000 | 1.5 | 150 |

The above results reveal that the modulated films are better than the nitride-free single layer films particularly with respect to the corrosion resistance, the wear loss and the specific resistance.

It will be noted that nitriding may adversely influence the magnetic anisotropy and saturation magnetostrain of alloys and thus does not necessarily give an alloy composition imparted with the best soft magnetic characteristics. In this case, an optimum starting alloy composition should be properly chosen in accordance with a concentration of nitrogen used.

EXAMPLE 4

Targets of $Fe_{100-x}Si_x$ in which x=6, 12 or 18 atomic percent were each used for sputtering in an Ar gas of $1.1 \times 10^{-2}$ Torr., or a mixed gas of the Ar gas and 10% by partial pressure of a nitrogen gas, thereby obtaining Fe-Si alloy films and Fe-Si-N alloy films.

Subsequently, the target was sputtered first in an Ar gas and then in a mixed gas of an Ar gas and 10% by partial pressure of a nitrogen gas alternately so that each layer had a thickness of about 200 angstroms, i.e. a compositional modulation wavelength, λ, of 400 angstroms, thereby obtaining Fe-Si/Fe-Si-N multilayered films. The multilayered film had a total number of the layers of 1000.

For the fabrication of the multilayered films, the alternate change of from the Ar gas to the mixed gas will cause not only a reduction in amount of the other constituent elements corresponding to an amount of the nitrogen present in the atmosphere, but also a difference in sputtering amount of the elements between the Ar gas and the mixed gas. This change occurs periodically whenever the atmospheres are changed. The resultant multilayered film has thus a composition involving an inherent periodic change in phase and amplitude, i.e. it becomes a simple, compositionally modulated film.

Moreover, the above procedure was repeated using a target of $Fe_{95-x'}Si_{x'}Mo_5$, in which x'=0, 1, 6, 12, 18, 20 atomic percent. The target contained the additive element of Mo for thermal stabilization. As a result, an Fe-Mo film, Fe-Si-Mo films, Fe-Si-Mo-N films and Fe-Si-Mo/Fe-Si-Mo-N multilayered films were made, respectively. These films were each subjected to measurements of magnetic characteristics, corrosion resistance, and wear resistance in the same manner as in the foregoing examples.

The results are shown in Table 4 below.

TABLE 4

| No. | Sample Alloy (x, x' = Si content in target) | | Saturation Magnetization (Gauss) | Coercive Force immediately after fabrication (Oe) | Wear Loss (μm) | Corrosion Resistance |
|---|---|---|---|---|---|---|
| 1 | Fe—Si | (x = 6) | 19000 | 17 | 10 | poor |
| 2 | " | (x = 12) | 17500 | 8 | 8 | poor |
| 3 | " | (x = 18) | 16000 | 12 | 7 | poor |
| 4 | Fe—Si—N | (x = 6) | 16000 | >40 | 1 | very good |
| 5 | " | (x = 12) | 14000 | >40 | 1 | very good |
| 6 | " | (x = 18) | 12000 | >40 | 1 | very good |
| 7 | Fe—Si/Fe—Si—N | (x = 6) | 17000 | 5 | 3 | good |
| 8 | " | (x = 12) | 15000 | 4 | 2 | good |
| 9 | " | (x = 18) | 13000 | 4 | 2 | good |
| 10 | Fe—Mo | (x' = 0) | 18000 | 20 | 7 | poor |
| 11 | Fe—Si—Mo | (x' = 1) | 17500 | 20 | 6 | poor |
| 12 | " | (x' = 6) | 15500 | 16 | 4 | poor |
| 13 | " | (x' = 12) | 13500 | 8 | 4 | poor |
| 14 | " | (x' = 18) | 11500 | 10 | 4 | poor |
| 15 | " | (x' = 20) | 10500 | 12 | 4 | poor |
| 16 | Fe—Mo—N | (x' = 0) | 16000 | >40 | 1 | very good |
| 17 | Fe—Si—Mo—N | (x' = 1) | 15500 | >40 | 1 | very good |
| 18 | " | (x' = 6) | 13500 | >40 | 1 | very good |
| 19 | " | (x' = 12) | 11500 | >40 | 1 | very good |
| 20 | " | (x' = 18) | 9500 | >40 | 1 | very good |
| 21 | " | (x' = 20) | 8500 | >40 | 1 | very good |
| 22 | Fe—Mo/Fe—Mo—N | (x' = 0) | 17000 | 8 | 2 | good |
| 23 | Fe—Si—Mo/Fe—Si—Mo—N | (x' = 1) | 16500 | 4 | 2 | good |
| 24 | " | (x' = 6) | 14500 | 3 | 1 | good |
| 25 | " | (x' = 12) | 12500 | 3 | 1 | good |
| 26 | " | (x' = 18) | 10500 | 3 | 1 | good |
| 27 | " | (x' = 20) | 9500 | 3 | 1 | good |

EXAMPLE 5

The sample Nos. 2,5,8,13,19 and 25 made in Example 4 were each thermally treated or annealed in vacuum at a temperature of 420° C. or 580° C. for 40 minutes and subjected to measurement of coercive force, Hc. The results are shown in Table 5.

TABLE 5

| No. | Sample Alloy (x, x' = Si content in target) | | Hc (Oe) immediately after fabrication | annealed at 420° C. | annealed 580° C. |
|---|---|---|---|---|---|
| 2 | Fe—Si | (x = 12) | 8 | 4 | 5 |
| 5 | Fe—Si—N | (x = 12) | >40 | >40 | 40 |
| 8 | Fe—Si/Fe—Si—N | (x = 12) | 4 | 2 | 4 |
| 13 | Fe—Si—Mo | (x' = 12) | 8 | 7 | 7 |
| 19 | Fe—Si—Mo—N | (x' = 12) | >40 | >40 | 40 |
| 23 | Fe—Si—Mo/Fe—Si—Mo—N | (x' = 12) | 3 | 2 | 1 |

As will be apparent from the above results, the Mo-containing sample 25 has better thermal stability than the sample 8 free of Mo and the characteristics are further improved by the annealing. The Mo-free sample 8 slightly deteriorates when thermally treated at high temperatures. The nitrided single layer films rarely exhibit soft magnetic characteristics irrespective of the annealing.

EXAMPLE 6

Targets of $Fe_{88-u}Si_{12}Nb_u$, in which u=1, 5 or 10 atomic percent, were sputtered in the same manner as in Example 4 using an Ar gas atmosphere and a mixed gas atmosphere of an Ar gas and 10% by partial pressure of a nitrogen gas, thereby forming multilayered films each having 50 nitride-free layers and 50 nitride layers. The respective films were thermally treated at 420° C. and 580° C. for 40 minutes and subjected to measurements of magnetic characteristics. The results are shown in Table 6 below.

TABLE 6

| No. | Sample Alloy | | Saturation Magnetization (Gauss) | Coercive Force Hc(Oe) | | |
|---|---|---|---|---|---|---|
| | | | | Immediately after fabrication | annealed at 420° C. | 580° C. |
| 28 | Fe—Si—Nb/Fe—Si—Nb—N | (u = 1) | 16500 | 4 | 2 | 2 |
| 29 | " | (u = 5) | 13000 | 3 | 2 | 1 |
| 30 | " | (u = 10) | 9000 | 3 | 3 | 3 |

The above results reveal that the sample 28 to which Nd is added is more stable than the sample 8 of Example 5 in which any additive element is added, when annealed at high temperatures. The effect of the addition is significant when the amount of Nb is 1 atomic percent or more, but when the amount exceeds 10 atomic percent, the saturation magnetization tends to lower. Accordingly, the amount of the additive element is in the range of from 1 to 10 atomic percent.

The reason why the addition of Nb contributes to thermal stability is considered to result from strong chemical bonding between N and Nb.

EXAMPLE 7

Various targets of $Fe_{85}Si_{12}T'_3$ in which T'=Nb, Ta, Ti, Zr, Hf, Cr, Mo or Wo were treated in the same manner as in Example 3 to make multilayered films of the invention composed of nitride layers and nitride-free layers, followed by thermal treatment at different temperatures in the same manner as in Example 4 except that the sputtering time was changed so that the compositional modulation wavelength, $\lambda$, was changed from 200 to 3000 angstroms. The resultant films were subjected to measurement of coercive force. The results are shown in Table 7 below.

TABLE 7

| | | | Coercive Force (Oe) | | |
| | | | At The Time of Fabrica- | Annealed at | |
| No. | Sample Alloys | $\lambda$ (Å) | tion | 420° C. | 580° C. |
| --- | --- | --- | --- | --- | --- |
| 31 | Fe—Si—Nb/Fe—Si—Nb—N | 200 | 2 | 1 | 1 |
| 32 | " | 400 | 3 | 2 | 1 |
| 33 | " | 1000 | 4 | 3 | 2 |
| 34 | " | 2000 | 6 | 5 | 5 |
| 35 | Fe—Si—Mo/Fe—Si—Mo—N | 400 | 2 | 1 | 1 |
| 36 | " | 1000 | 3 | 2 | 2 |
| 37 | " | 2000 | 6 | 5 | 5 |
| 38 | " | 3000 | 10 | 9 | 9 |
| 39 | Fe—Si—Ta/Fe—Si—Ta—N | 400 | 3 | 2 | 1 |
| 40 | Fe—Si—W/Fe—Si—W—N | 400 | 2 | 1 | 1 |
| 41 | Fe—Si—Ti/Fe—Si—Ti—N | 400 | 3 | 2 | 1 |
| 42 | Fe—Si—Zr/Fe—Si—Zr—N | 400 | 4 | 3 | 2 |
| 43 | Fe—Si—Hf/Fe—Si—Hf—N | 400 | 4 | 3 | 3 |
| 44 | Fe—Si—Cr/Fe—Si—Cr—N | 400 | 4 | 2 | 2 |

From the above results, it will be seen that when the modulation wavelength is less than 2000 angstroms, the lowering of the coercive force, Hc, becomes pronounced.

EXAMPLE 8

A target of $Fe_{85}Si_{12}Nb_3$ was used for sputtering in an Ar gas and a mixed gas of Ar and n% of $N_2$ gas, in which n=0, 1, 2, 5 and 20), alternately thereby forming multilayered films in which each layer had a thickness of about 200 angstroms. The multilayered film had 500 Fe-Si-Nb layers and 500 Fe-Si-Nb-N layers and thus a total thickness of 20 micrometers. The respective films were subsequently annealed at a temperature of 500° C. to obtain compositionally modulated films except for the case of n=0%. The amount of the nitrogen in the respective films was determined by the AES analysis to check the influences on a corrosion resistance and magnetic characteristics. The corrosion resistance was determined in the same manner as in Example 4.

For comparison, an Fe-Si-Nb single layer film having a thickness of 20 micrometers was made and subjected to similar measurements. The results are summarized in Table 8 below.

TABLE 8

| No. | Sample Alloy | n (%) | N content in Alloy (%) | Saturation Magnetization (Gauss) | Coercive Force, Hc (Oe) | Corrosion Resistance |
| --- | --- | --- | --- | --- | --- | --- |
| 45 | Fe—Si—Nb single layer film | 0 | 0 | 15500 | 7 | poor |
| 46 | compositionally modulated Fe—Si—Nb—N alloy | 1 | 1 | 15500 | 3 | good |
| 47 | compositionally modulated Fe—Si—Nb—N alloy | 2 | 2 | 15500 | 2 | very good |
| 48 | compositionally modulated Fe—Si—Nb—N alloy | 5 | 4 | 15000 | 1 | very good |
| 49 | compositionally modulated Fe—Si—Nb—N alloy | 20 | 15 | 9000 | 4 | very good |

The comparison between the sample Nos. 45 and 46 reveals that when the nitrogen content in the alloy is 1%, the corrosion resistance is significantly improved and the soft magnetic characteristics are also improved due to the compositional modulation in the alloy film. In addition, when the content of N is 15%, the saturation magnetization considerably lowers and such a film may not be useful as a magnetic head.

EXAMPLE 9

Targets of $Fe_{92}Si_7Ru_1$ and $Fe_{75}Si_{20}Ru_5$ were provided for sputtering in an Ar gas of $1.1 \times 10^{-2}$ Torr., and in a mixed gas of Ar and 10% of $N_2$ gas, thereby obtaining Fe-Si-Ru alloy films and Fe-Si-Ru-N alloy films, respectively.

The above two targets were each subjected to alternate sputtering in an Ar gas and then in a mixed gas of Ar and 10% by partial pressure of $N_2$ gas, thereby obtaining two types of Fe-Si-Ru/Fe-Si-Ru-N multilayered films from each target in which the thicknesses of the one layer in the multilayered films were, respectively, about 1000 angstroms and 200 angstroms corresponding to compositional modulation wavelengths of 2000 angstroms and 400 angstroms. Each multilayered film had a total thickness of 20 micrometers. These films were each subjected to measurement of magnetic characteristics, after which all the films were thermally treated at 420° C. for 40 minutes, followed by measurement of magnetic characteristics. The results are summarized in Table 9, in which film compositions are also indicated.

istics to some extent over the sample Nos. 52 and 53, but are not necessarily satisfactory as compared with the sample Nos. 56 and 57 in which t<1000 angstroms or x<2000 angstroms.

EXAMPLE 10

The general procedure of Example 9 was repeated, thereby obtaining alloy films as sample Nos. to 50' to 57' which had, respectively, the same compositions as the sample Nos. 50 to 57 but each film had a total thickness of 40 micrometers. These films were each subjected to measurement of corrosion resistance by the use of a metallic tape and a commercially available video tape

TABLE 9

| No. | Film Structure | Film Composition | Layer Thickness, t, or Modulation Wavelength, λ | Coercive Force (Oe) | |
|---|---|---|---|---|---|
| | | | | At the Time of Formation | After Thermal Treatment |
| 50 | single layer | $Fe_{93}Si_6Ru_1$ | 1 μm thick single layer | 6 | 8 |
| 51 | " | $Fe_{77}Si_{18}Ru_5$ | 1 μm thick single layer | 16 | 4 |
| 52 | " | $(Fe_{93}Si_6Ru_1)_{0.84}N_{16}$ | 1 μm thick single layer | >40 | >40 |
| 53 | " | $(Fe_{77}Si_{18}Ru_5)_{0.84}N_{16}$ | 1 μm thick single layer | >40 | >40 |
| 54 | multilayer compositionally modulated | $Fe_{92}Si_7Ru_1/(Fe_{94}Si_5Ru_1)_{0.84}N_{16}$ $(Fe_{93}Si_6Ru_1)_{0.92}N_8$ | t = 1000Å λ = 2000Å | 12 | 5 |
| 55 | multilayer compositionally modulated | $Fe_{75}Si_{20}Ru_5/(Fe_{79}Si_{16}Ru_5)_{0.84}N_{16}$ $(Fe_{77}Si_{18}Ru_5)_{0.92}N_8$ | t = 1000Å λ 2000Å | 16 | 4 |
| 56 | multilayer compositionally modulated | $Fe_{92}Si_7Ru_1/(Fe_{94}Si_5Ru_1)_{0.84}N_{16}$ $(Fe_{93}Si_6Ru_1)_{0.92}N_8$ | t = 200Å λ = 400Å | 5 | 2 |
| 57 | multilayer compositionally modulated | $Fe_{752}Si_{20}Ru_5/(Fe_{79}Si_{16}Ru_5)_{0.84}N_{16}$ $(Fe_{77}Si_{18}Ru_5)_{0.92}N_8$ | t = 200Å λ = 400Å | 8 | 1 |

The sample Nos. 54 to 57 of the present invention have a multilayered structure at the time of the formation and are thermally treated to give compositionally modulated structure. With regard to the former structure, the compositions of the nitride layer and the nitride-free layer are indicated. An average composition of the film as a whole is indicated for the latter structure.

From the results shown above, it will be seen that the multilayered films of the sample Nos. 56 and 57 according to the invention are improved in the soft magnetic characteristics over the nitride-free single layer films of the sample Nos. 50 and 51 and the nitride single layer films of the sample Nos. 52 and 53. Further, the sample Nos. 54 and 55 having t=1000 angstroms or λ=2000 angstroms are improved in the soft magnetic characterrecorder in which the film was set as a dammy magnetic head. The evaluation was made in such a way that a wear loss of the film of the sample No. 50' was taken as 1, with which a wear loss of the other samples were normalized. Moreover, the respective samples were allowed to stand in distilled water for 48 hours, after which a degree of discoloration was evaluated as follows.

Good: not discolored
Moderate: slightly discolored
Poor: discolored

These samples were also subjected to measurements of specific resistance by a four-terminal method and saturation magnetization, 4πMs, by VSM. The results are summarized in Table 10 below.

TABLE 10

| Sample No. | Film Structure | Wear Loss | Corrosion Resistance | Specific Resistance (microohms-cm) | Saturation Magetization (Gauss) |
|---|---|---|---|---|---|
| 50' | single layer | 1 | poor | 70 | 19000 |
| 51' | " | 0.8 | moderate | 70 | 14000 |
| 52' | single nitride layer | 0.2 | good | 180 | 17000 |
| 53' | " | 0.1 | good | 180 | 13000 |
| 54' | compositionally modulated film | 0.2 | good | 160 | 18000 |
| 55' | compositionally modulated film | 0.1 | good | 160 | 14000 |
| 56' | compositionally modulated film | 0.2 | good | 160 | 18000 |
| 57' | compositionally | 0.1 | good | 160 | 14000 |

TABLE 10-continued

| Sample No. | Film Structure | Wear Loss | Corrosion Resistance | Specific Resistance (microohms-cm) | Saturation Magentization (Gauss) |
|---|---|---|---|---|---|
| | modulated film | | | | |

The sample Nos. 50' to 57' were all used for the above measurements after thermal treatment at 420° C.

From the results of the Tables 9 and 10, it will be seen that the sample Nos. 56 and 57 of the invention are satisfactory with respect to the soft magnetic characteristics, corrosion resistance, wear resistance, electric resistance and saturation magnetization.

EXAMPLE 11

The general procedure of Example 9 was repeated using a target of $Fe_{84}Si_{13}Ru_3$ and 10% by partial pressure of nitrogen gas, thereby forming a multilayered film of 500 nitride layers and 500 nitride-free layers, each layer having a thickness of about 200 angstroms, followed by thermal treatment at 420° C. to obtain a compositionally modulated film. The above procedure was repeated using a partial pressure of nitrogen gas of 1%, 2%, 20% and 30%, thereby obtaining compositionally modulated films. These films were subjected to measurements of the saturation magnetization, wear resistance, and corrosion resistance in the same manner as in Example 10. The results are shown in Table 11 below.

TABLE 11

| Sample No. | Partial Pressure | Average Film Composition | Saturation Magnetization (Gauss) | Wear Loss Relative To No. 50' | Corrosion Resistance |
|---|---|---|---|---|---|
| 58 | 1 | $(Fe_{85}Si_{12}Ru_3)_{0.995}N_{0.5}$ | 17000 | 0.9 | poor |
| 59 | 2 | $(Fe_{85}Si_{12}Ru_3)_{0.99}N_1$ | 16500 | 0.6 | good |
| 60 | 10 | $(Fe_{85}Si_{12}Ru_3)_{0.92}N_8$ | 15000 | 0.2 | very good |
| 61 | 20 | $(Fe_{85}Si_{12}Ru_3)_{0.85}N_{15}$ | 11000 | 0.1 | very good |
| 62 | 30 | $(Fe_{85}Si_{12}Ru_3)_{0.80}N_{20}$ | 8000 | 0.1 | very good |

As will be apparent from the above, the content of nitrogen in the film is preferably 1 atomic percent or higher in consideration of the corrosion and wear resistances. For keeping the saturation magnetization at a level of not less than 10,000 G, the N content is preferably not larger than 15 atomic percent.

As will be understood from the foregoing, the compositionally modulated nitride magnetic alloy films of the invention are Fe-based soft magnetic materials which have high saturation magnetization, good corrosion and wear resistances and a relatively high electric resistance. The compositionally modulated magnetic alloy films include those films which nitride alloy layers and nitride-free alloy layers merely superposed alternately.

What is claimed is:

1. A compositionally modulated, nitrided magnetic alloy film consisting essentially of an alloy having an average composition of the following general formula $$T_{\bar{a}}X_{\bar{b}}N_{\bar{c}}$$

in which T represents at least one member selected from the group consisting of Fe, Fe and Co, and Fe and Ni, X represents at least one member selected from the group consisting of Si, Ge, Si and Ga, and Ge and Al, N is nitrogen, $71 \leq \bar{a} \leq 97$, $2 \leq \bar{b} \leq 28$ and $1 \leq \bar{c} \leq 20$, each on the atomic percent basis, provided that $\bar{a}+\bar{b}+\bar{c}=100$, at least the nitrogen being compositionally modulated along the thickness of the film.

2. A compositionally modulated, nitrided magnetic alloy film according to claim 1, wherein said film has a thickness of from 0.1 to 100 micrometers.

3. A compositonally modulated, nitrided magnetic alloy film according to claim 1, wherein said film has a multilayered structure which comprises a plurality of the layers of the nitrided alloy and a plurality of the layers of the nitride-free alloys which are alternately superposed.

4. A compositionally modulated, nitrided magnetic alloy film according to claim 3, wherein each layer has a thickness of from 50 to 1000 angstroms.

5. A compositionally modulated, nitrided magnetic alloy film according to claim 1, wherein said film contains the nitrogen throughout the film and the content of the nitrogen is modulated along the thickness of the film.

6. A compositionally modulated, nitrided magnetic alloy film according to claim 5, wherein said film has a modulation wave length of less than 2000 angstroms.

7. A compositionally modulated, nitrided magnetic alloy film according to claim 1, wherein T is Fe and X is Si.

8. A compositionally modulated, nitrided magnetic alloy film according to claim 1, wherein T is a mixture of Fe and Co and X is Si.

9. A compositionally modulated, nitrided magnetic alloy film according to claim 1, wherein T is Fe and X is a mixture of Si and Ga.

10. A compositionally modulated, nitrided magnetic alloy film according to claim 1, wherein T is Fe and X is a mixture of Ge and Al.

11. A compositionally modulated, nitrided magnetic alloy film consisting essentially of an alloy having an average composition of the following formula $$Fe_{\bar{x}}Si_{\bar{y}}N_{\bar{z}}T'_{\bar{w}}$$

in which T' represents at least one member selected from the group consisting of Nb, Ta, Ti, Zr, Hf, Cr, Mo and W, and $70 \leq \bar{x} \leq 97$, $1 \leq \bar{y} \leq 20$, $1 \leq \bar{z} \leq 15$ and $1 \leq \bar{w} \leq 10$, each on the atomic percent basis, provided that $\bar{x}+\bar{y}+\bar{z}+\bar{w}=100$, at least the content of the nitrogen along the thickness of the film being compositionally modulated.

12. A compositionally modulated, nitrided magnetic alloy film according to claim 11, wherein said alloy film has a multilayered structure comprises a plurality of the layers of the nitrided alloy and a plurality of the layers of the nitride-free alloys which are alternately superposed.

13. A compositionally modulated, nitrided magnetic alloy film according to claim 11, wherein said film contains the nitrogen throughout the film and the content of the nitrogen is modulated along the thickness of the film.

14. A compositionally modulated, nitrided magnetic alloy film according to claim 13, wherein said film has a modulation wavelength of less than 2000 angstroms.

15. A compositionally modulated, nitrided magnetic alloy film consisting essentially of an alloy having an average composition of the following formula $$(Fe_{a'}Si_{b'}Ru_{c'})(100-d')/100N_{d'}$$

in which $70 \leq a' \leq 96$, $3 \leq b' \leq 20$, $1 \leq c' \leq 6$ and $1 \leq d' \leq 15$, each on the atomic percent basis, provided that $a'+b'+c'+d'=100$, and the content of the nitrogen along the thickness of the film being compositionally modulated.

16. A compositionally modulated, nitrided magnetic alloy film according to claim 15, wherein said film has a multilayered structure which comprises a plurality of the layers of the nitrided alloy and a plurality of the layers of the nitrided-free alloys which are alternately superposed.

17. A compositionally modulated, nitrided magnetic alloy film according to claim 15, wherein said film contains the nitrogen throughout the film and the content of the nitrogen is modulated along the thickness of the film.

18. A compositionally modulated, nitrided magnetic alloy film according to claim 17, wherein said film has a modulation wavelength of less than 2000 angstroms.

19. A method for making a compositionally modulated, nitrided magnetic alloy film having an average composition of $T_aX_bN_c$ wherein T represents at least one member selected from the group consisting of Fe, Fe and Co, and Fe and Ni, X represents at least one member selected from the group consisting of Si, Ge, Si and Ga, and Ge and Al, and N is nitrogen $71 \leq a \leq 97$, $2 \leq b \leq 28$ and $1 \leq c \leq 20$, each based on the atomic percent basis, provided that $a+b+c=100$, at least the nitrogen being compositionally modulated along the thickness of the film, the method comprising providing a target of a nitride-free Fe based alloy, and subjecting said target to sputtering first in an Ar gas atmosphere for a time sufficient to form a nitride-free Fe based alloy layer on a substrate and then in the Ar gas atmosphere to which nitrogen gas is added to a level of from 0.1 to 50% by partial pressure, so that a nitride alloy layer is formed on the nitride-free Fe based alloy layer.

20. A method according to claim 19, wherein the sputtering in the Ar gas atmosphere and in the nitrogen-added Ar gas atmosphere is repeated a desired number of times, whereby the resultant film has a multilayered structure consisting essentially of a plurality of the nitride-free Fe alloy layers and a plurality of the nitrided Fe alloy layers superposed alternately.

21. A method according to claim 19 or 20, wherein when the thickness of the nitride-free Fe alloy layer is taken as t' and the thickness of the nitrided layer is taken as t, $t \geq t'/2$.

22. A method according to claim 19 or 20, further comprising annealing the resultant film under conditions sufficient to cause at least the nitrogen in the film to be compositionally modulated along the thickness of the film.

23. A method according to claim 22, wherein the annealing is effected at a temperature of from 300° to 700° C. for a time sufficient to cause the compositional modulation.

24. A method for making a compositionally modulated, nitride magnetic alloy film having an average composition of $Fe_xSi_yN_zT'_w$
wherein T' represents at least one member selected from the group consisting of Nb, Ta, Ti, Zr, Hf, Cr, Mo and W, and $70 \leq x \leq 97$, $1 \leq y \leq 20$, $1 \leq z \leq 15$ and $1 \leq w \leq 10$, each based on the atomic percent basis, provided that $x+y+z+w=100$, at least the nitrogen being compositionally modulated along the thickness of the film, the method comprising providing a target of a nitride-free Fe based alloy, and subjecting said target to sputtering first in an Ar gas atmosphere for a time sufficient to form a nitride-free Fe based alloy layer on a substrate and then in the Ar gas atmosphere to which nitrogen gas is added to a level of from 0.1 to 50% by partial pressure, so that a nitride alloy layer is formed on the nitride-free Fe based alloy layer.

25. A method according to claim 24, wherein the sputtering in the Ar gas atmosphere and in the nitrogen-added Ar gas atmosphere is repeated a desired number of times, whereby the resultant film has a multilayered structure consisting essentially of a plurality of the nitride-free Fe alloy layers and a plurality of the nitrided Fe alloy layers superposed alternately.

26. A method according to claim 24 or 25, wherein when the thickness of the nitride-free Fe alloy layer is taken as t' and the thickness of the nitrided layer is taken as t, $t \geq t'/2$.

27. A method according to claim 24 or 25, further comprising annealing the resultant film under conditions sufficient to cause at least the nitrogen in the film to be compositionally modulated along the thickness of the film.

28. A method according to claim 27, wherein the annealing is effected at a temperature from 300° to 700° C. for a time sufficient to cause the compositional modulation.

29. A method for making a compositionally modulated, nitride magnetic alloy film having an average composition $$Fe_{a'}Si_{b'}Ru_{c'})(100-d')/100N_{d'}$$

wherein $70 \leq a \leq 96$, $3 \leq b' \leq 20$, $1 \leq c' \leq 6$ and $1 \leq d' \leq 15$, each based on the atomic percent basis, provided that $a'+b'+c'+d'=100$, at least the nitrogen being compositionally modulated along the thickness of the film, the method comprising providing a target of a nitride-free Fe based alloy, and subjecting said target to sputtering first in an Ar gas atmosphere for a time sufficient to form a nitride-free Fe based alloy layer on a substrate and then in the Ar gas atmosphere to which nitrogen gas is added to a level of from 0.1 to 50% by partial pressure, so that a nitride alloy layer is formed on the nitride-free Fe based alloy layer.

30. A method according to claim 29, wherein the sputtering in the Ar gas atmosphere and in the nitrogen-added Ar gas atmosphere is repeated a desired number of times, whereby the resultant film has a multilayered structure consisting essentially of a plurality of the nitride-free Fe alloy layers and a plurality of the nitrided Fe alloy layers superposed alternately.

31. A method according to claim 29 or 30, wherein when the thickness of the nitride-free Fe alloy layer is taken as t' and the thickness of the nitrided layer is taken as t, $t \geqq t'/2$.

32. A method according to claim 29 or 30, further comprising annealing the resultant film under conditions sufficient to cause at least the nitrogen in the film to be compositionally modulated along the thickness of the film.

33. A method according to claim 32, wherein the annealing is effected at a temperature of from 300° to 700° C. for a time sufficient to cause the compositional modulation.

* * * * *